US008965756B2

(12) United States Patent
Duwenhorst et al.

(10) Patent No.: US 8,965,756 B2

(45) Date of Patent: Feb. 24, 2015

(54) AUTOMATIC EQUALIZATION OF COLORATION IN SPEECH RECORDINGS

(75) Inventors: Sven Duwenhorst, Hamburg (DE); Martin Schmitz, Braunschweig (DE)

(73) Assignee: Adobe Systems Incorporated, San Jose, CA (US)

(*) Notice: Subject to any disclaimer, the term of this patent is extended or adjusted under 35 U.S.C. 154(b) by 1017 days.

(21) Appl. No.: 13/047,422

(22) Filed: Mar. 14, 2011

(65) Prior Publication Data

US 2012/0239391 A1 Sep. 20, 2012

(51) Int. Cl.

| | |
|---|---|
| ***G10L 25/00*** | (2013.01) |
| ***G10L 21/00*** | (2013.01) |
| ***G10L 15/00*** | (2013.01) |
| ***H03G 3/00*** | (2006.01) |
| ***H04R 3/00*** | (2006.01) |

(52) U.S. Cl.

CPC ............... *H04R 3/00* (2013.01); *H04S 2400/15* (2013.01)

USPC ........... 704/225; 704/200; 704/205; 704/226; 704/227; 704/228; 704/231; 704/233; 381/59; 381/58; 381/94.1; 381/104; 381/106; 381/107

(58) Field of Classification Search

CPC ......... G10L 15/22; G10L 21/00; G10L 21/02; G10L 21/0202; G10L 21/0205; G10L 21/0208; G10L 21/0216; G10L 21/0232; G10L 21/0316; G10L 21/0332; G10L 21/0324; G10L 25/00; G10L 25/48; G10L 2021/00; G10L 2021/02; G10L 2021/0208; G10L 2021/02082; G10L 2021/0316; G10L 2021/0364; H03G 3/32

USPC .............. 130/200, 200.1, 205, 225, 226–228, 130/231, 233; 704/200, 200.1, 205, 225, 704/226–228, 231, 233

See application file for complete search history.

(56) References Cited

U.S. PATENT DOCUMENTS

| | | | | |
|---|---|---|---|---|
| 5,812,972 | A * | 9/1998 | Juang et al. | 704/234 |
| 5,937,377 | A * | 8/1999 | Hardiman et al. | 704/225 |
| 6,411,927 | B1 * | 6/2002 | Morin et al. | 704/224 |
| 7,254,535 | B2 | 8/2007 | Kushner et al. | |
| 7,292,974 | B2 * | 11/2007 | Kemp | 704/234 |
| 7,333,618 | B2 * | 2/2008 | Shuttleworth et al. | 381/57 |
| 7,336,793 | B2 | 2/2008 | Horbach et al. | |
| 7,623,572 | B2 * | 11/2009 | Li | 375/229 |
| 7,742,592 | B2 | 6/2010 | Faller | |
| 8,090,120 | B2 * | 1/2012 | Seefeldt | 381/104 |
| 8,094,826 | B2 * | 1/2012 | Pedersen | 381/58 |
| 8,229,125 | B2 * | 7/2012 | Short | 381/56 |
| 8,489,393 | B2 * | 7/2013 | Alves et al. | 704/219 |
| 8,761,408 | B2 * | 6/2014 | Yoneda et al. | 381/59 |
| 2006/0126865 | A1 * | 6/2006 | Blamey et al. | 381/102 |
| 2006/0291681 | A1 * | 12/2006 | Klinkby et al. | 381/318 |
| 2009/0034747 | A1 * | 2/2009 | Christoph | 381/71.4 |
| 2009/0080666 | A1 * | 3/2009 | Uhle et al. | 381/17 |
| 2009/0110218 | A1 * | 4/2009 | Swain | 381/300 |

(Continued)

*Primary Examiner* — Paras D Shah

(74) *Attorney, Agent, or Firm* — Shook, Hardy & Bacon L.L.P.

(57) ABSTRACT

Systems and methods to automatically equalize coloration in speech recordings is provided. In example embodiments, a reference spectral shape based on a reference signal is determined. An estimated spectral shape for an input signal is derived. Using the estimated spectral shape and the reference spectral shape a comparison is performed to determine gain settings. The gain settings comprise a gain value for each filter of a filter system. Using gain values associated with the gain setting, automatic equalization is performed on the input signal.

20 Claims, 7 Drawing Sheets

(56) References Cited

U.S. PATENT DOCUMENTS

| | | | | |
|---|---|---|---|---|
| 2009/0147975 | A1 | 6/2009 | Horbach et al. | |
| 2009/0225980 | A1* | 9/2009 | Schmidt et al. | 379/406.02 |
| 2010/0111330 | A1* | 5/2010 | Baumgarte | 381/119 |
| 2010/0215194 | A1* | 8/2010 | Bhattacharya | 381/106 |
| 2011/0228951 | A1* | 9/2011 | Sekiya et al. | 381/94.1 |
| 2013/0010982 | A1* | 1/2013 | Elko et al. | 381/94.2 |

* cited by examiner

AUTOMATIC EQUALIZATION OF COLORATION IN SPEECH RECORDINGS

FIELD

The present disclosure relates generally to audio signal processing, and in a specific example embodiment, to automatic equalization of coloration in speech recordings.

BACKGROUND

In typical speaking environments, a speaker does not provide a constant level of speech. For example, people tend to move when they speak. If the speaker moves his head or turns away from the microphone, sound will be different than when the speaker is speaking directly into the microphone. Additionally, when multiple speakers are in the same environment, one speaker will be closer to a microphone and thus provide louder or clearer speech than the speaker that is further away. As such, speech may not be at a constant loudness or clarity.

BRIEF DESCRIPTION OF DRAWINGS

Various ones of the appended drawings merely illustrate example embodiments of the present invention and cannot be considered as limiting its scope.

DETAILED DESCRIPTION

The description that follows includes systems, methods, techniques, instruction sequences, and computing machine program products that embody illustrative embodiments of the present invention. In the following description, for purposes of explanation, numerous specific details are set forth in order to provide an understanding of various embodiments of the inventive subject matter. It will be evident, however, to those skilled in the art that embodiments of the inventive subject matter may be practiced without these specific details. In general, well-known instruction instances, protocols, structures, and techniques have not been shown in detail. As used herein, the term "or" may be construed in either an inclusive or exclusive sense.

Systems and methods to provide automatic equalization of coloration in speech records are provided. In example embodiments, a reference spectral shape based on a reference signal is determined. The reference signal comprises any audio signal that may be used as a reference for equalizing the input signal.

An estimated spectral shape for an input signal is derived. In example embodiments, a plurality of averagers are used to measure the input signal. The plurality of averagers may each comprise a different time constant. For example, the plurality of averagers may include a short time constant averager, a mid time constant averager, and a long time constant averager. By using averagers having different time constants, short time changes in the input signal may be identified while also obtaining a good approximation of the input spectral shape over a longer time period. The values of the plurality of averagers may be combined to derive the estimated spectral shape of the input signal.

Using the estimated spectral shape and the reference spectral shape a comparison is performed to determine gain settings. The gain settings may comprise a gain value for each filter of a filter system. Using gain values associated with the gain setting, automatic equalization is performed on the input signal.

Figure 1:
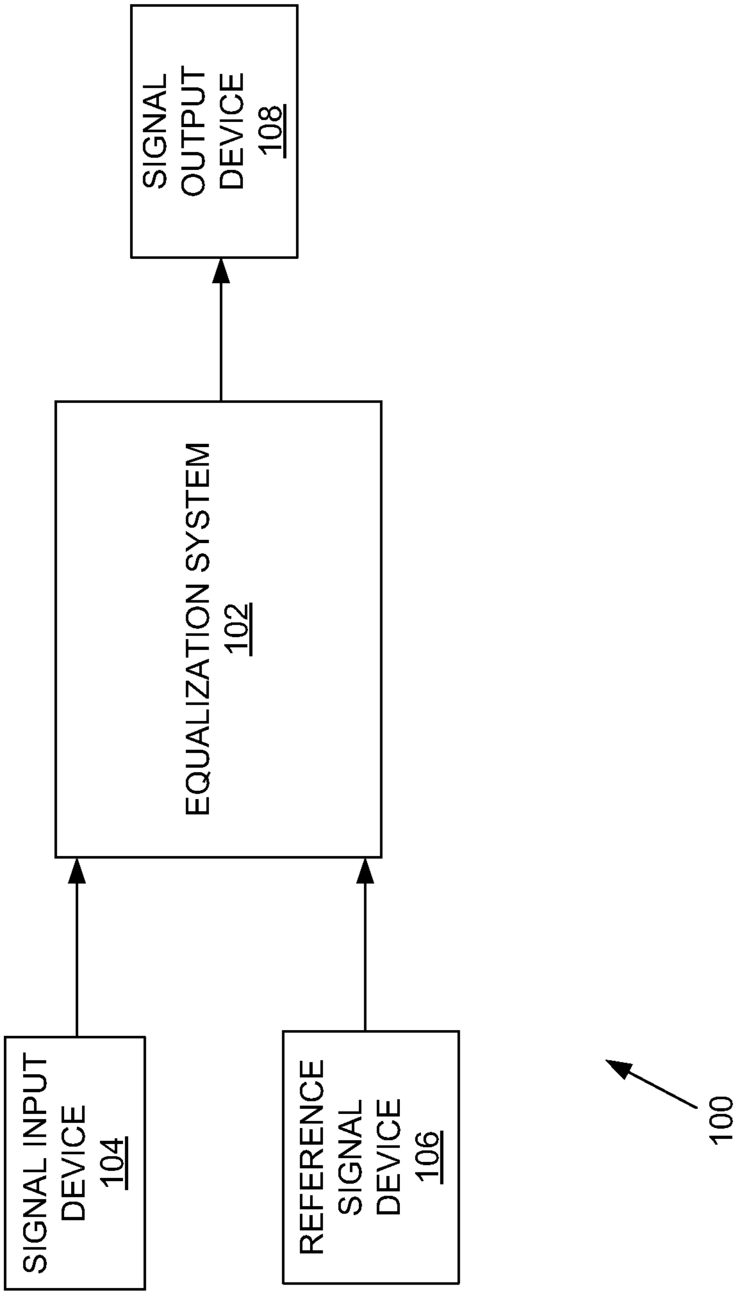
FIG. 1 is a block diagram illustrating an example of an environment in which example embodiments may be deployed.

With reference to FIG. 1, an embodiment of an environment 100 in which example embodiments of the present invention may be deployed is shown. An equalization system 102 is configured to receive input signals from a signal input device 104. The signal input device 104 may comprise, for example, a microphone, video camera, or any other device that is capable of capturing audio from an environment. The signal input device 104 may also provide record audio to the equalization system 102.

The equalization system 102 further receives a reference signal from a reference signal device 106. The reference signal may be any audio stream that is used for comparison to the input signal. In one embodiment, the reference signal is a recorded signal. Based on the reference signal, the equalization system 102 automatically equalizes the input signal. The equalization system 102 and its processes will be discussed in more detail below.

The result of the equalization system 102 is improved audio which is then passed onto a signal output device 108. The signal output device 108 may comprise, for example, a speaker, a recorder (e.g., for recording the output signal), or any other device configured to utilize the output signal. It should be noted that while audio is improved using example embodiments of the present subject matter, the input and output signals may comprise more than audio. For example, the input and output signals may be a combination of audio and video. Using example embodiments, the audio portion of the input signals are automatically equalized to improve sound quality. Furthermore, additional devices may be coupled along the signal path for audio or video latency compensation. This ensures audio/video synchronization.

Figure 2:
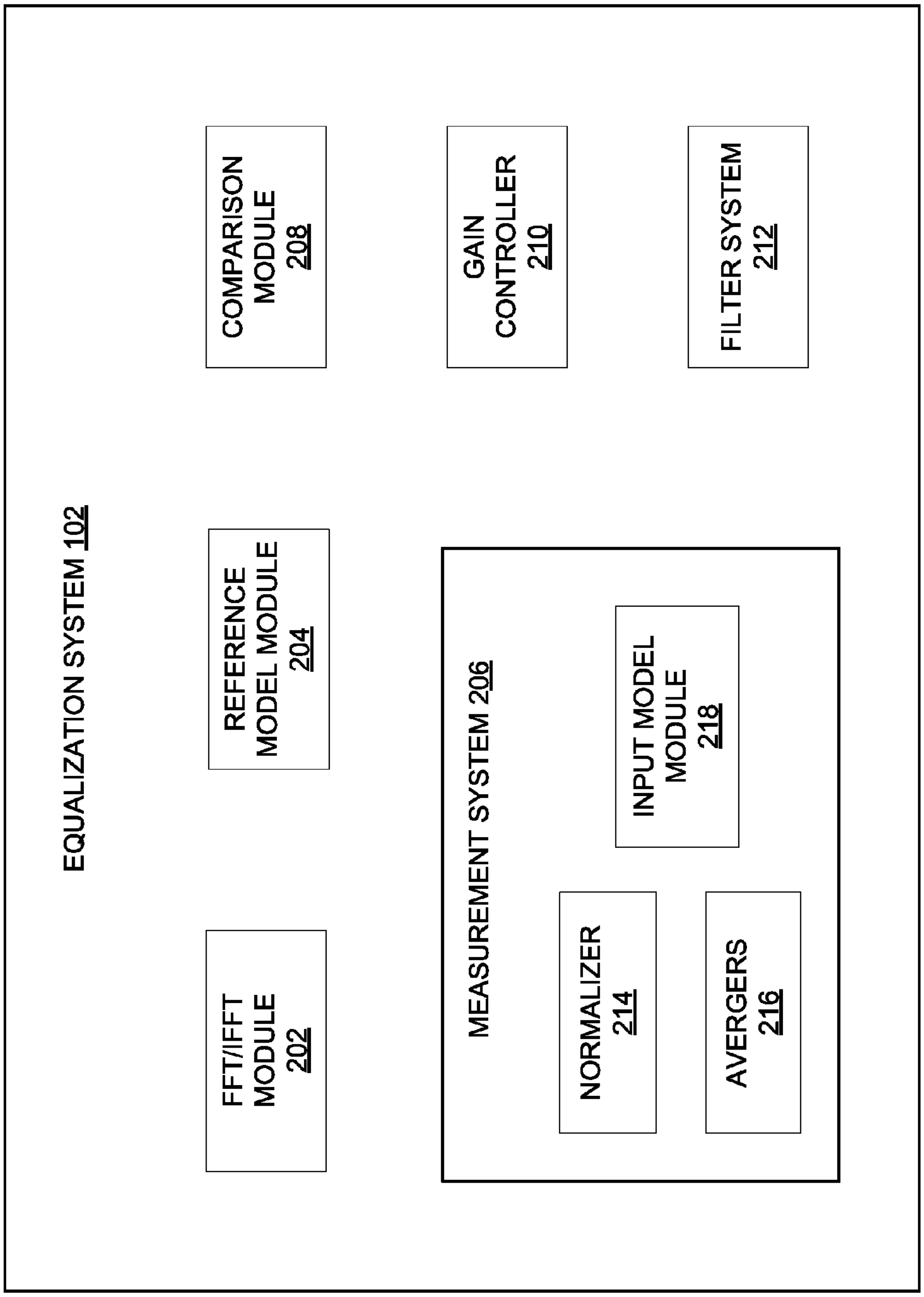
FIG. 2 is a block diagram illustrating an example embodiment of an equalization system.

FIG. 2 is a block diagram illustrating an example embodiment of the equalization system 102. In example embodiments, the equalization system 102 comprises a Fast Fourier Transform/Inverse Fast Fourier Transform (FFT/IFFT) module 202, a reference model module 204, a measurement system 206, a comparison module 208, a gain controller 210, and a filter system 212 all communicatively coupled together. Alternative embodiments may combine or separate one or more of the components of the equalization system 102, combine or separate the respective functions of these components, or comprise more or fewer components.

The FFT/IFFT module 202 transforms signals between the time domain and the frequency domain. In some embodiments, an input signal may be converted into the frequency domain for processing by the equalization system 102. Once an equalized signal is generated by the equalization system 102, the equalized signal may be converted back to the time domain for output to the signal output device 108.

The reference model module 204 defines spectral shapes for the reference signal. In some embodiments, the reference signal may be a flat response such as a neutral sound. In other embodiments, the reference signal may be any arbitrary sound which may or may not be in the same environment as the input signal. For example, the reference signal may be from an anchorperson talking into a microphone while the input signal may be a live interview from outside a studio. In this example, the recorded sound from the anchorperson speaking in the studio is the reference signal that the reference model module 204 uses to define the reference spectral shape.

Figure 4:
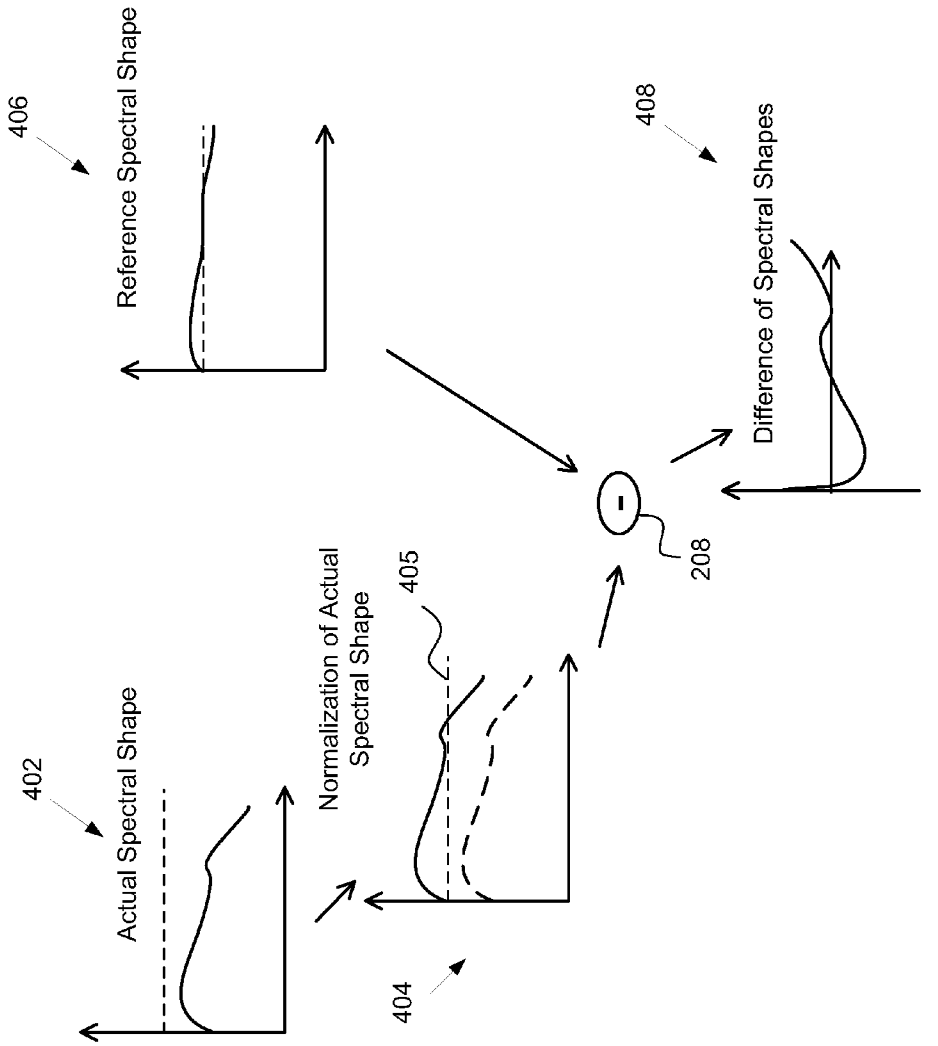
FIG. 4 graphically illustrates spectral shape analysis performed by the equalization system.

The measurement system 206 measures an input spectral shape. The measurement system 206 includes a normalizer 214 to normalize the input signal to a certain average level (rms). In a time domain, the measured (input) sounds may be lifted to a level similar to the reference sound. Alternatively in the spectral domain, the input spectral shape may be lifted to a level of the reference spectral shape in the spectral domain. The normalizing process may be arbitrary complex. For example, in the absence of a useful signal, the normalizer 214 may boost the ambience noise too much. In this situation, the normalizer 214 gain may be limited. Additional preprocessing steps may also be considered (e.g., noise gate, denoiser). A graphical example of the normalization process is shown in FIG. 4.

In some embodiments, the measurement system 206 includes a plurality of averagers 216, each with a different time or integration constant. For instance, the measurement system 206 may include three averagers 216 with an averager 216 having a short time constant (e.g., one second), an averager 216 having a mid time constant (e.g., three seconds), and an averager 216 having a long time constant (e.g., ten seconds). By using averagers 216 having different time constants, short time changes in the input signal may be identified while a good approximation of the input spectral shape (e.g., over an average spectrum over a longer time period) may be obtained. While three averagers 216 are provided in the example, it is contemplated that any number of averages 216 having any type of time constant may be used.

The outputs of the averagers 216 are spectral estimates that then are used to derive a measured output by an input model module 218. Each individual band (bin) is compared. If a bin of the spectral estimate of the short or mid time averager 216 exceeds a value of the long time averager 216, the value of the short or mid time averager 216 becomes current to the long time averager 216 otherwise the bin value decays linearly or exponentially. In alternative embodiments, an average of the values from the averagers 216 may be the measured output. In yet other embodiment, some smoothing and/or averaging over a bin and its neighbor bins may be used to determine the measure output. The resulting measured output is a modelled estimated spectral shape for the input signal.

As such, the automatic control of the equalization process is based on a difference between short time average which immediately catches a change in the audio (e.g., a person turns their head away from the microphone) and a long time average. This difference may be used to control and amplify certain frequencies in order to improve the audio signal.

The comparison module 208 compares the difference between the estimated spectral shape and the reference spectral shape. The difference defines gain settings for the filter system 212. In example embodiments, the comparison module 208 combines and weights the spectral bins to get a wide band response and suppress estimation errors (e.g., averaged out). The resulting value defines a gain change for each filter node of the filter system 212.

The gain controller 210 analyzes the gain change output of the comparison module 208 and determines if the gain value satisfies a maximum or minimum gain value. Thus, the gain controller 210 may truncate a gain value that exceeds a maximum gain. This truncation is performed in order to alleviate perceptible audio changes produced by applying too much gain to the input signal.

For example, if the difference between the estimated spectral shape and the reference spectral shape is 30-40 dB, the gain controller 210 will reduce the gain value to, for example, 6 dB. This lower gain value will provide sound improvement without adding any drastic effects to the input signal. Thus, the gain controller 210 controls the amount of gain applied to the input signal.

The filter system 212 comprises a plurality of filters that automatically apply the calculated gain value from the gain controller 210 to the input signal. In some embodiments, the filter system 212 comprises multiple second order filters. The amount of filters may vary depending on the complexity of the coloration. For each filter, a side chain signal may be extracted upon which an envelope follower is computed. If an envelope follower signal falls below or rises above a given threshold, the filter gain may be swept from 0 dB to maximum gain. In some embodiments, the envelope follower operates in the frequency domain on a set of weighted bins of the normalized input spectrum that gives a spectral power threshold, which is compared with the reference spectral shape. As such, a relative gain shift may be computed. The gain may be updated for each FFT update.

Figure 3:
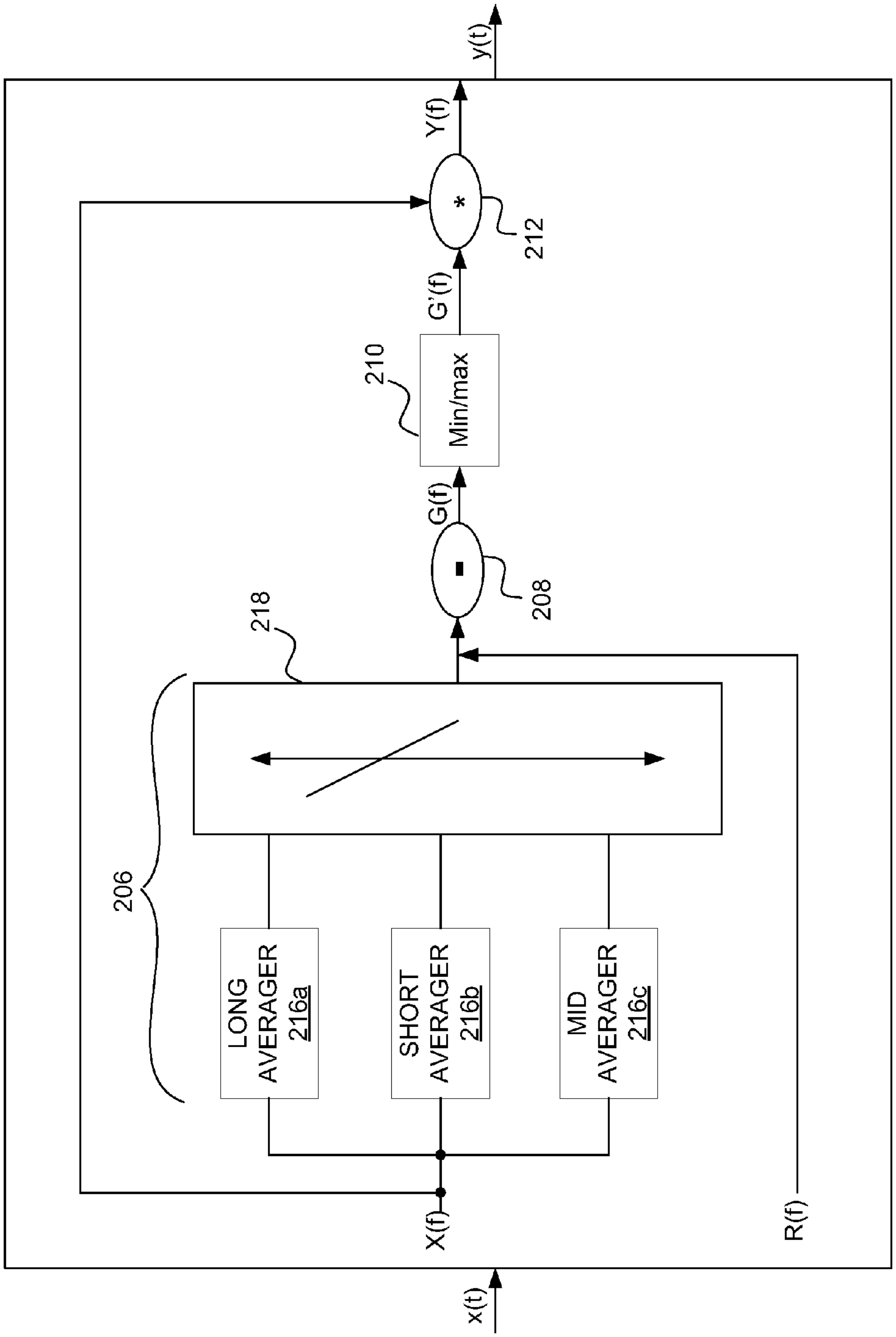
FIG. 3 is a diagram illustrating signal processing in the equalization system.

FIG. 3 is a diagram illustrating signal processing in the equalization system in accordance with example embodiments. An input signal in the time domain, x(t), may be converted into the frequency domain by the FFT/IFFT module 202 (not shown in FIG. 3). The resulting spectra, X(f), is provided to the measuring system 206 and the filter system 212. In some embodiments, the FFT/IFFT module 202 comprises a short time Fourier transform.

Each of the averagers 216 fetches the input signal in parallel. Thus, each of the averagers 216 gets the same input spectrum of a current time for analysis. In the current example, the long averager 216*a* has a long time constant of twenty seconds, the short averager 216*b* has a short time constant of one second, and the mid averager 216*c* has a mid time constant of ten seconds.

The outputs of the averagers 216 are used to derive a measured output by the input model module 218. In some embodiments, each individual band (bin) is compared to determine a measured output. The resulting measured output is a modelled estimated spectral shape for the input signal.

The comparison module 208 compares the difference between the estimated spectral shape received from the input model module 218 and the reference spectral shape from the reference model module 204 (not shown in FIG. 3). The difference defines gain settings for the filter system 212. In example embodiments, the comparison module 208 combines and weights the spectral bins to get a wide band response and suppress estimation errors (e.g., averaged out). The resulting value defines a gain value, G(f), for each frequency. Frequencies may be grouped into bands whereby a gain may be computed for each band. Each band may be represented by a filter node of the filter system 212.

According to some embodiments, the gain may be computed as follows. X(n, f) is a spectra based on averager n and frequency f (fft bin). The frequencies may be grouped into bands such that G(n, k) represents a frequency group k of averager n. A maximum gain, Gmax(k) may be determined whereby for each band k, max=0 and for each averager n, if G(n, k)>max then max=G(n, k). Thus, Gmax(k)=max.

In alterative embodiments, the max gain computation for each frequency band may be represented by weighted_gain=0.2*G(n, k−1)+0.6*G(n,k)+0.2*G(n,k+1) for example. If weighted_gain>max, then max=weighted_gain. Because gains are calculated per bands rather than individual gains per frequency, the gains per frequency could be computed by a linear interpolation from one to another band. A similar approach can be used to compute the gain of one frequency band.

The gain controller 210 analyzes the gain value, G(f), of the comparison module 208 and determines if the gain value satisfies a maximum or minimum gain threshold. For example, the gain controller 210 may truncate a gain value that exceeds a maximum gain. The output transfer function, G'(f), of the gain controller 210 is provided to the filter system 212 which automatically applies the modified gain value to the input signal. The resulting equalized spectra, Y(f) may be converted back into the time domain (e.g., y(t)) for output via the signal output device 108. It should be noted that the filter system 212 may perform the equalization in frequency or time domain. If the equalization is performed in the time domain, the transfer function is mapped to a set of time domain filters.

FIG. 4 graphically illustrates spectral shape analysis performed by the equalization system 102. An actual shape 402 of the input signal may be normalized into a normalized version 404 by the normalizer 214. In the present example, the spectral shape of the actual spectral shape 402 is lifted relative to a normalization threshold 405. The normalized version 404 is provided to the comparison module 208. The comparison module 208 also receives a reference spectral shape 406 from the reference model module 204. A difference in spectral shape 408 is determined by the comparison module 208. This difference in spectral shape 408 is utilized by the gain controller 210 to determine the actual gain values to be applied by the filter system 212 to the input signal.

Figure 5:
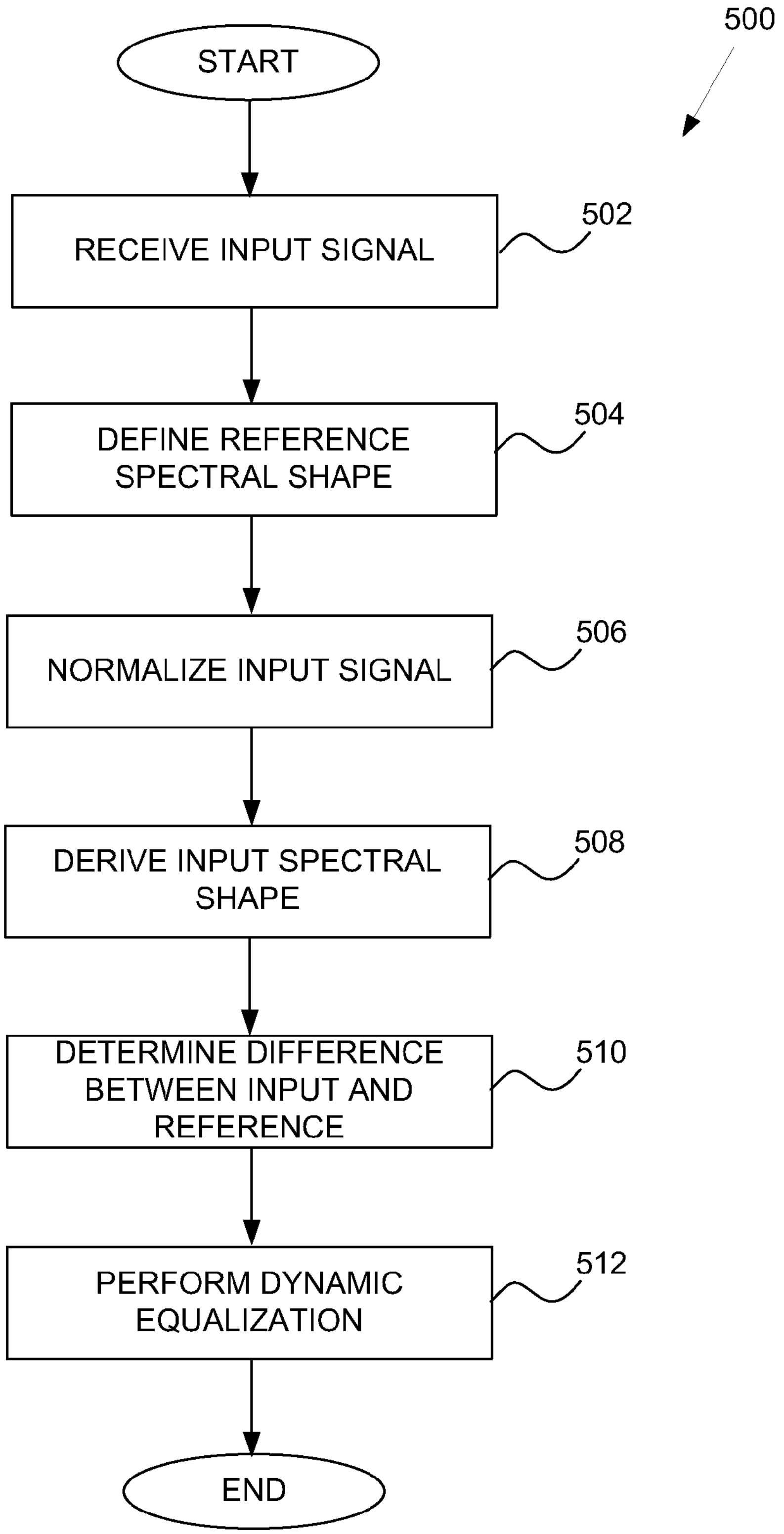
FIG. 5 is a flowchart of a method for automatically equalizing coloration in speech recordings.

FIG. 5 is a flowchart of a method 500 for automatically equalizing coloration in speech recordings. In operation 502, an input signal is received by the equalization system 102. The input signal may be captured audio from a microphone, recorded audio and video from a storage device, and any other type of signal that includes audio.

In operation 504, a reference spectral shape is defined. In example embodiments, a reference signal is received by the equalization system 102. The reference model module 204 defines the reference spectral shapes using the reference signal. In some embodiments, the reference signal may be a flat response such as a neutral sound. In other embodiments, the reference signal may be any arbitrary sound which may or may not be in the same environment as the input signal.

The input signal is normalized in operation 506. A normalizer 214 of the measurement system 206 normalizes the input signal to a certain average level (e.g., to a normalization threshold). In various embodiments, the measured (input) sounds of the input spectral shape may be lifted to a level the normalization threshold. In some embodiment, the normalization threshold may be the reference spectral shape in the spectral domain.

In operation 508, the spectral shape of the input signal is derived. In some embodiments, the measurement system 206 includes a plurality of averagers 216, each with a different time or integration constant. The averagers may include a short time constant averager 216*b*, a mid time constant averager 216*c*, and a long time constant averager 216*a*. By using these averagers 216 having different time constants, short time changes in the input signal may be identified while a good approximation of the overall input spectral shape (e.g., over an average spectrum over a longer time period) may also be obtained.

The outputs of the averagers are spectral estimates that then are used to derive a measured output by an input model module 218. The resulting measured output is a modelled estimated spectral shape for the input signal.

In operation 510, a difference between the estimated spectral shape and the reference spectral shape is determined. The comparison module 208 compares the difference between the estimated spectral shape and the reference spectral shape. The difference defines gain settings for the filter system 212. In example embodiments, the comparison module 208 combines and weights the spectral bins to get a wide band response and suppress estimation errors (e.g., averaged out). The resulting value defines a gain value for each filter node of the filter system 212.

Automatic equalization is then performed in operation 512. Operation 512 will be discussed in more detail in connection with FIG. 6 below. As such, the automatic control of the equalization process is based on a difference between short time average which immediately catches a change in the audio (e.g., a person turns their head away from the microphone) and a long time average. This difference may be used to control and amplify certain frequencies in order to improve the audio signal.

Figure 6:
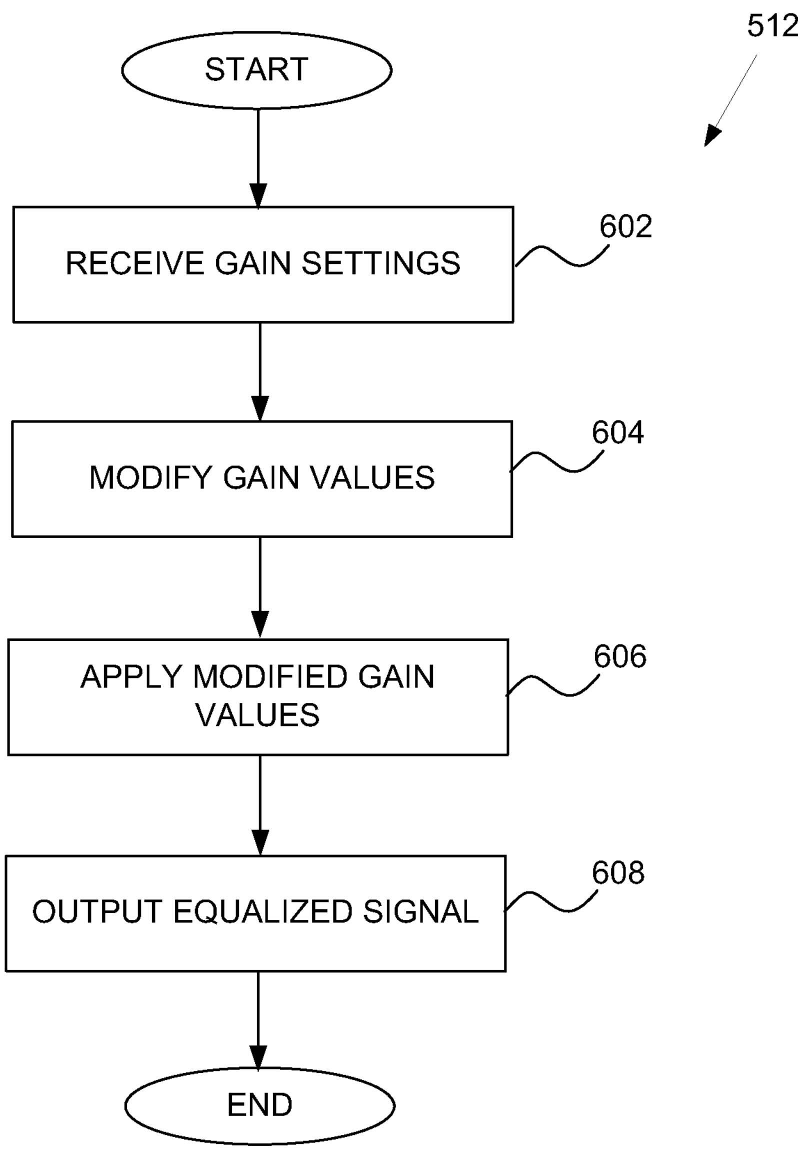
FIG. 6 is a flowchart of a method for performing automatic equalization.

Referring now to FIG. 6, a method (e.g., operation 512) for automatic equalization is shown. In operation 602, gain settings are determined. The gain settings are received from the comparison module 208.

In operation 604, the gain values may be modified. The gain controller 210 analyzes the gain settings from the comparison module 208 and determines if each gain value satisfies a maximum or minimum gain value. Thus, the gain controller 210 may truncate a gain value that exceeds a maximum gain. This truncation is performed in order to alleviate perceptual audio changes produced by applying too much gain to the input signal. Thus, the gain controller 210 controls the amount of gain applied to the input signal.

In operation 606, the gain values are automatically applied to the input signal. In example embodiment, a plurality of filters of the filter system 212 automatically apply the calculated gain from the gain controller 210 to the input signal. In some embodiments, the filter system 212 comprises multiple second order filters.

The equalized signal is then output in operation 608. The equalized output signal is provided to the signal output device 108 for output. The output may comprise presenting the audio (e.g., through a speaker) or recording of the audio (e.g., into storage for later playback).

Modules, Components, and Logic

Certain embodiments described herein may be implemented as logic or a number of modules, engines, components, or mechanisms. A module, engine, logic, component, or mechanism (collectively referred to as a "module") may be a tangible unit capable of performing certain operations and configured or arranged in a certain manner. In certain exemplary embodiments, one or more computer systems (e.g., a standalone, client, or server computer system) or one or more components of a computer system (e.g., a processor or a group of processors) may be configured by software (e.g., an application or application portion) or firmware (note that software and firmware can generally be used interchangeably herein, as is known by a skilled artisan) as a module that operates to perform certain operations described herein.

In various embodiments, a module may be implemented mechanically or electronically. For example, a module may comprise dedicated circuitry or logic that is permanently configured (e.g., within a special-purpose processor, application specific integrated circuit (ASIC), or array) to perform certain operations. A module may also comprise programmable logic or circuitry (e.g., as encompassed within a general-purpose processor or other programmable processor) that is temporarily configured by software or firmware to perform certain operations. It will be appreciated that a decision to implement a module mechanically, in the dedicated and permanently configured circuitry, or in temporarily configured circuitry (e.g., configured by software) may be driven by, for example, cost, time, energy-usage, and package size considerations.

Accordingly, the term "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which modules or components are temporarily configured (e.g., programmed), each of the modules or components need not be configured or instantiated at any one instance in time. For example, where the modules or components comprise a general-purpose processor configured using software, the general-purpose processor may be configured as respective different modules at different times. Software may accordingly configure the processor to constitute a particular module at one instance of time and to constitute a different module at a different instance of time.

Modules can provide information to, and receive information from, other modules. Accordingly, the described modules may be regarded as being communicatively coupled. Where multiples of such modules exist contemporaneously, communications may be achieved through signal transmission (e.g., over appropriate circuits and buses) that connect the modules. In embodiments in which multiple modules are configured or instantiated at different times, communications between such modules may be achieved, for example, through the storage and retrieval of information in memory structures to which the multiple modules have access. For example, one module may perform an operation and store the output of that operation in a memory device to which it is communicatively coupled. A further module may then, at a later time, access the memory device to retrieve and process the stored output. Modules may also initiate communications with input or output devices and can operate on a resource (e.g., a collection of information).

Example Machine Architecture and Machine-Readable Medium

Figure 7:
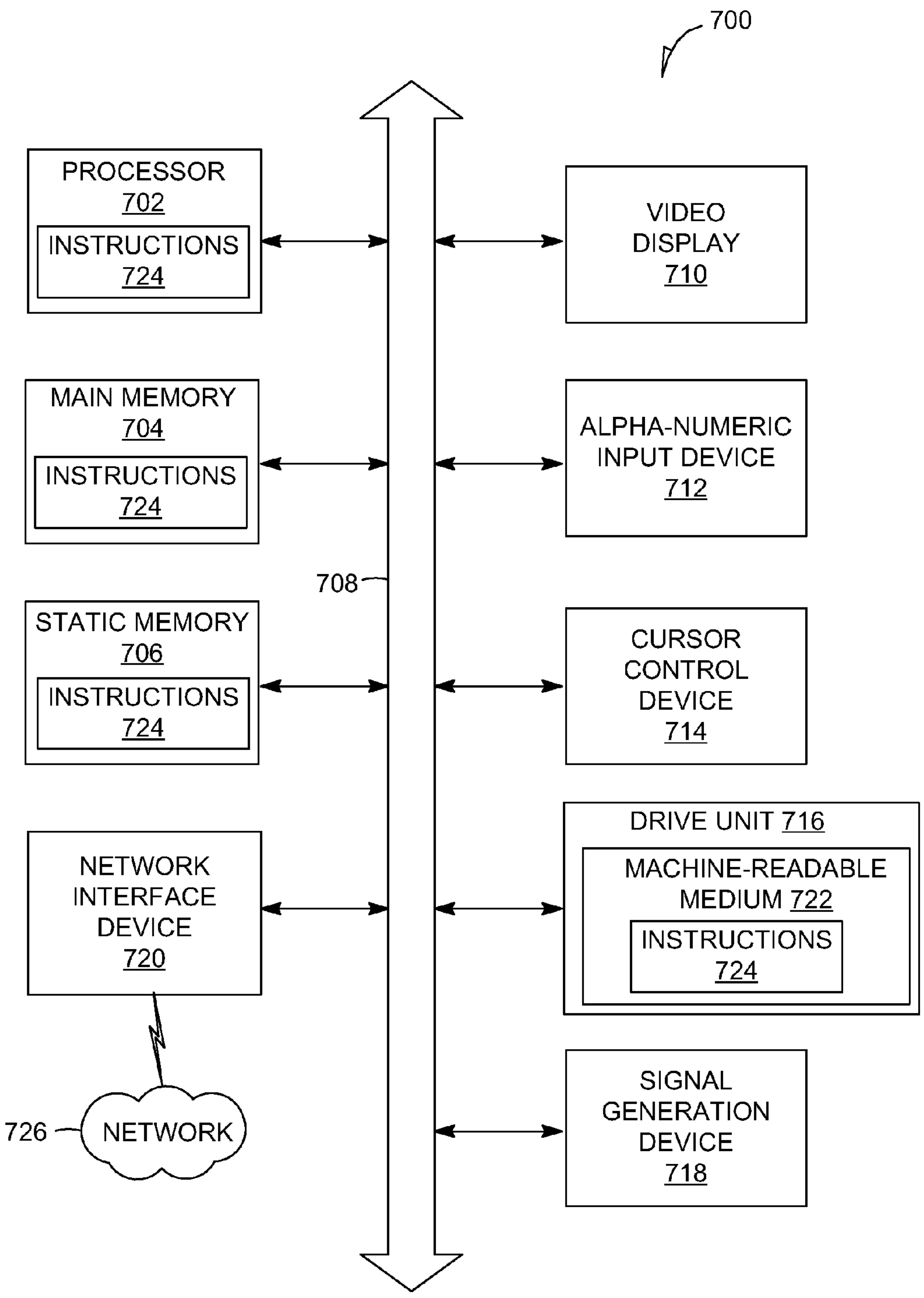
FIG. 7 is a simplified block diagram of a machine in an example form of a computing system within which a set of instructions for causing the machine to perform any one or more of the methodologies discussed herein may be executed.

With reference to FIG. 7, an exemplary embodiment extends to a machine in the example form of a computer system 700 within which instructions for causing the machine to perform any one or more of the methodologies discussed herein may be executed. In alternative exemplary embodiments, the machine operates as a standalone device or may be connected (e.g., networked) to other machines. In a networked deployment, the machine may operate in the capacity of a server or a client machine in server-client network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a network router, a switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The exemplary computer system 700 may include a processor 702 (e.g., a central processing unit (CPU), a graphics processing unit (GPU) or both), a main memory 704 and a static memory 706, which communicate with each other via a bus 708. The computer system 700 may further include a video display unit 710 (e.g., a liquid crystal display (LCD) or a cathode ray tube (CRT)). In exemplary embodiments, the computer system 700 also includes one or more of an alphanumeric input device 712 (e.g., a keyboard), a user interface (UI) navigation device or cursor control device 714 (e.g., a mouse), a disk drive unit 716, a signal generation device 718 (e.g., a speaker), and a network interface device 720.

Machine-Readable Storage Medium

The disk drive unit 716 includes a machine-readable storage medium 722 on which is stored one or more sets of instructions 724 and data structures (e.g., software instructions) embodying or used by any one or more of the methodologies or functions described herein. The instructions 724 may also reside, completely or at least partially, within the main memory 704 or within the processor 702 during execution thereof by the computer system 700, the main memory 704 and the processor 702 also constituting machine-readable media.

While the machine-readable storage medium 722 is shown in an exemplary embodiment to be a single medium, the term "machine-readable storage medium" may include a single medium or multiple media (e.g., a centralized or distributed database, or associated caches and servers) that store the one or more instructions. The term "machine-readable storage medium" shall also be taken to include any tangible medium that is capable of storing, encoding, or carrying instructions for execution by the machine and that cause the machine to perform any one or more of the methodologies of embodiments of the present invention, or that is capable of storing, encoding, or carrying data structures used by or associated with such instructions. The term "machine-readable storage medium" shall accordingly be taken to include, but not be limited to, solid-state memories and optical and magnetic media. Specific examples of machine-readable storage media include non-volatile memory, including by way of example semiconductor memory devices (e.g., Erasable Programmable Read-Only Memory (EPROM), Electrically Erasable Programmable Read-Only Memory (EEPROM), and flash memory devices); magnetic disks such as internal hard disks and removable disks; magneto-optical disks; and CD-ROM and DVD-ROM disks.

Transmission Medium

The instructions 724 may further be transmitted or received over a communications network 726 using a transmission medium via the network interface device 720 and utilizing any one of a number of well-known transfer protocols (e.g., HyperText Transfer Protocol (HTTP)). Examples of communication networks include a local area network (LAN), a wide area network (WAN), the Internet, mobile telephone networks, Plain Old Telephone (POTS) networks, and wireless data networks (e.g., WiFi and WiMax networks). The term "transmission medium" shall be taken to include any intangible medium that is capable of storing, encoding, or carrying instructions for execution by the machine, and includes digital or analog communications signals or other intangible media to facilitate communication of such software.

Although an overview of the inventive subject matter has been described with reference to specific exemplary embodiments, various modifications and changes may be made to these embodiments without departing from the broader spirit and scope of embodiments of the present invention. Such embodiments of the inventive subject matter may be referred to herein, individually or collectively, by the term “invention” merely for convenience and without intending to voluntarily limit the scope of this application to any single invention or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present invention. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present invention as represented by the appended claims. The specification and drawings are, accordingly, to be regarded in an illustrative rather than a restrictive sense.

What is claimed is:

1. A method comprising:

defining a reference spectral shape based on a reference signal;

deriving an estimated spectral shape for an input signal that comprises an audio signal, wherein the deriving comprises using a plurality of averagers to measure the input signal, wherein at least two averagers of the plurality of averagers comprise a short time constant averager, a mid time constant averager, or a long time constant averager, wherein the at least two averagers have different time constants;

comparing, using one or more processors, the estimated spectral shape to the reference spectral shape to determine gain settings, the gain settings comprising a gain value for each filter of a filter system;

automatically performing equalization on the input signal using gain values associated with the gain settings to provide an equalized signal; and outputting the equalized signal to a signal output device.

2. The method of claim 1, further comprising normalizing the input signal based on a normalization threshold prior to deriving the estimated spectral shape.

3. The method of claim 1, wherein each of the plurality of averagers has a different time constant.

4. The method of claim 3, further comprising comparing values of each individual band of each of the plurality of averagers to determine a measured value used to derive the estimated spectral shape.

5. The method of claim 4, wherein the comparing values of each individual band of each of the plurality of averagers comprises setting a long time constant value equal to a short time constant value or mid time constant value based on the short time constant value or the mid time constant value, respectively, exceeding the long time constant value.

6. The method of claim 3, wherein the deriving of the estimated spectral shape comprises averaging values from the plurality of averagers to obtain an average value across the plurality of averagers.

7. The method of claim 3, further comprising:

using the short time constant averager of the plurality of averagers to determine a short time constant value;

using the mid time constant averager of the plurality of averagers to determine a mid time constant value; and using the long time constant averager of the plurality of averagers to determine a long time constant value.

8. The method of claim 1, further comprising:

determining whether each gain value of the gain settings exceeds a gain threshold; and based on at least one gain value of the gain settings exceeding the gain threshold, setting the at least one gain value to the gain threshold to generate a modified gain value.

9. The method of claim 8, wherein automatically performing equalization comprises using a plurality of filters to automatically apply the gain values and the modified gain value to the input signal.

10. A system comprising:

one or more processors; and one or more computer storage media storing a plurality of computer software components executable by the one or more processors, the plurality of computer software components comprising:

a reference model module configured to define a reference spectral shape based on a reference signal, a plurality of averagers configured to measure an input signal comprising an audio signal, wherein at least two averagers of the plurality of averagers comprise a short time constant averager, a mid time constant averager, or a long time constant averager, wherein the at least two averagers have different time constants, an input model module configured to derive, based on outputs of the plurality of averagers, an estimated spectral shape for the input signal, a comparison module configured to compare the estimated spectral shape to the reference spectral shape to determine gain settings, the gain settings comprising a gain value for each filter of a filter system, the filter system, wherein the filter system is configured to provide an equalized signal by automatically performing equalization on the input signal using gain values associated with the gain settings, and an output module configured to output the equalized signal to a signal output device.

11. The system of claim 10, further comprising a normalizer configured to normalize the input signal based on a normalization threshold prior to deriving the estimated spectral shape.

12. The system of claim 10, wherein each of the plurality of averagers has a different time constant.

13. The system of claim 12, wherein the input model module is further configured to compare values of each individual band of each of the plurality of averagers to determine a measured value used to derive the estimated spectral shape.

14. The system of claim 10, further comprising a gain controller configured to determine whether each gain value of the gain settings exceeds a gain threshold, and based on at least one gain value exceeding the gain threshold, setting the at least one gain value to the gain threshold to generate a modified gain value.

15. The system of claim 10, wherein the plurality of averagers comprises the short time constant averager, the mid time constant averager, and the long time constant averager.

16. A non-transitory machine-readable storage medium in communication with at least one processor, the machine-readable storage medium storing instructions which, when executed by the at least one processor, performs a method comprising:

defining a reference spectral shape based on a reference signal;

deriving an estimated spectral shape for an input signal that comprises an audio signal, wherein the deriving comprises using a plurality of averagers to measure the input signal, wherein at least two averagers of the plurality of averagers comprise a short time constant averager, a mid time constant averager, or a long time constant averager, wherein the at least two averagers have different time constants;

comparing, using one or more processors, the estimated spectral shape to the reference spectral shape to determine gain settings, the gain settings comprising a gain value for each filter of a filter system;

automatically performing equalization on the input signal using gain values associated with the gain settings to provide an equalized signal; and outputting the equalized signal to a signal output device.

17. The non-transitory machine-readable storage medium of claim 16, wherein the method further comprises normalizing the input signal based on a normalization threshold prior to deriving the estimated spectral shape.

18. The non-transitory machine-readable storage medium of claim 16, wherein each of the plurality of averagers has a different time constant.

19. The non-transitory machine-readable storage medium of claim 18, wherein the method further comprises comparing values of each individual band of each of the plurality of averagers to determine a measured value used to derive the estimated spectral shape.

20. The non-transitory machine-readable storage medium of claim 19, wherein the method further comprises:

determining whether each gain value of the gain settings exceeds a gain threshold; and based on at least one gain value exceeding the gain threshold, setting the at least one gain value to the gain threshold to generate a modified gain value.

* * * * *